United States Patent [19]
Lou

[11] Patent Number: 6,159,793
[45] Date of Patent: Dec. 12, 2000

[54] STRUCTURE AND FABRICATING METHOD OF STACKED CAPACITOR

[75] Inventor: Chine-Gie Lou, Hsinchu Hsien, Taiwan

[73] Assignee: Worldwide Semiconductor Manufacturing Corp., Hsinchu, Taiwan

[21] Appl. No.: 09/299,956

[22] Filed: Apr. 26, 1999

[30] Foreign Application Priority Data

Mar. 24, 1999 [TW] Taiwan .................................. 88104636

[51] Int. Cl.$^7$ .............................................. H01L 21/8242
[52] U.S. Cl. ............................................ 438/255; 438/964
[58] Field of Search ..................... 438/253, 255, 438/256, 396, 398, 399, 665, 964

[56] References Cited

U.S. PATENT DOCUMENTS

| | | | |
|---|---|---|---|
| 5,930,641 | 7/1999 | Pan | 438/255 |
| 5,960,294 | 9/1999 | Zahurak et al. | 438/255 |
| 6,060,355 | 7/1999 | Batra et al. | 438/255 |

*Primary Examiner*—Chandra Chaudhari
*Attorney, Agent, or Firm*—J.C. Patents; Jiawei Huang

[57] ABSTRACT

A structure and method of fabricating a stacked capacitor which forms a hemispherical grain (HSG) polysilicon on the surface of a crown shaped amorphous silicon layer. By selective tungsten deposition, the HSG polysilicon and the amorphous silicon layer are displaced with a rough tungsten layer. A material with a high dielectric constant and a metal layer are formed in sequence as a dielectric layer and an upper electrode of the capacitor, so as to form a crown metal-insulator-metal (MIM) capacitor.

16 Claims, 4 Drawing Sheets

STRUCTURE AND FABRICATING METHOD OF STACKED CAPACITOR

CROSS-REFERENCE TO RELATED APPLICATION

This application claims the priority benefit of Taiwan application serial no. 88104636, filed Mar. 24, 1999, the full disclosure of which is incorporated herein by reference.

BACKGROUND OF THE INVENTION

1. Field of Invention

The present invention relates to a structure and method of fabricating a capacitor of a semiconductor memory. More particularly, the present invention relates to a structure and method of fabricating a stacked capacitor of a Dynamic Random Access Memory (DRAM).

2. Description of Related Art

A semiconductor memory, such as a DRAM, mainly consists of a transistor and a capacitor. Therefore, the improvement in the efficiency of the two tends to be the direction in which technology is developing.

When the semiconductor enters the deep sub-micron process, the size of the device becomes smaller. For the conventional DRAM structure, this means that the space used by the capacitor becomes smaller. Since computer software gradually becoming huge, more memory capacity is required. In the case where it is necessary to have a smaller size with sufficient memory capacity, the conventional method of fabricating the DRAM capacitor has to change in order to fulfill the requirements of the trend.

There are two approaches at present for reducing the size of the capacitor while increasing its capacitance. One way is to select a dielectric layer with a high dielectric constant, and the other is to increase the surface area of the lower electrode of the capacitor. For the first method. high dielectric constant (k) materials, for example, $Ta_2O_5$ with a dielectric constant of about 25 and $BaTiO_3$ with a dielectric constant well above five hundred, are becoming popular.

However, there are two main types of capacitors that increase the surface area of the lower electrode of the capacitor. These are the deep trench type and the stacked type, wherein the deep trench type capacitor is formed by digging out a trench with a depth of 6–7 $\mu$m.

The stacked capacitor is a principal method of fabricating the conventional semiconductor capacitor. Most of the semiconductor manufacturers, such as NEC in Japan and Samsung, in Korea have developed advanced technology which involves a size below 0.25 $\mu$m with a megabit (Mb) capacity for such a capacitor.

As the material having a high dielectric constant is used in the stacked capacitor, the material for the conventional upper and lower electrodes also need to be gradually replaced so as to improve the performance of the capacitor. The structure known as a metal-insulator-metal (MIM) structure has a low interfacial reaction to enhance the performance of the capacitor, and therefore it has become an important topic of research for the semiconductor capacitor in the future.

However. the conventional metal-insulator-polysilicon (MIS) capacitor which uses doped polysilicon as the lower electrode, can be formed into a hemispherical grain (HSG). crown, or fin electrode by a polysilicon storage node. This increases the surface area of the lower electrode of the capacitor and enhances the capacitance.

But for the MIM capacitor, it is difficult to transform uniform metal film into the shape of hemispherical grain, crown, or fin with the culrent semiconductor manufacturing technology.

SUMMARY OF THE INVENTION

Therefore, the present invention provides a structure and method of fabricating a stacked capacitor. The crown MIM capacitor with a rough lower electrode surface is formed by a well-developed HSG polysilicon manufacturing technology and a selective metal deposition technology to increase the surface area of the lower electrode of the capacitor.

The invention provides a method of fabricating the stacked capacitor. There is provided a substrate wherein a first dielectric layer is formed to cover the substrate. A contact is then formed in the first dielectric layer, which is filled with a doped polysilicon layer. An insulating layer is formed to further cover the first dielectric layer, while an opening is formed in the insulating layer to expose the contact. An amorphous silicon layer is conformally formed to cover the insulating layer and the opening. A photoresist layer is formed to cover the amorphous silicon layer. Parts of the photoresist layer and the amorphous silicon layer which cover the top surface of the insulating layer are removed, the photoresist layer remaining in the opening is then removed. A plurality of HSG polysilicon is formed on the exposed surface of the amorphous silicon layer in the opening. A first metal layer is used as a lower electrode of the stacked capacitor, which is formed via a selective metal deposition process to transform the HSG polysilicon and amorphous silicon layer into a metal layer. A second dielectric layer is then formed to cover the first metal layer, while a second metal layer is formed to cover the second dielectric layer. This second metal layer is used as an upper electrode of the stacked capacitor.

The invention provides a stacked capacitor structure which includes a substrate, a first dielectric layer covering the substrate surface, a contact which is formed in the first dielectric layer and filled with a doped polysilicon layer, and an insulating layer covering the surface of the first dielectric layer. This structure further comprises of an opening located above the contact, a first metal layer covering the opening, a second dielectric layer covering the surface of the first metal layer, and a second metal layer covering the surface of the second dielectric layer.

In the invention, a HSG polysilicon is formed on a crown surface of the amorphous silicon layer. The HSG polysilicon and the amorphous silicon layer are then transformed into tungsten layer by a selective tungsten deposition as the lower electrode of the capacitor. A material with a high dielectric constant and a metal layer are formed in sequence as the dielectric layer and the upper electrode of the capacitor so as to form a MIM capacitor.

The invention is applying a well-developed HSG polysilicon technology. Together with the selective tungsten deposition technology, the MIM capacitor having uniform grain size and film thickness of the lower electrode can be easily obtained.

The capacitor disclosed by the invention uses the material with a high dielectric constant for the dielectric layer of the capacitor, while it can also increase the surface area of the lower electrode of the capacitor. Thus, this A will benefit the application of the small size memory with a high capacitance.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
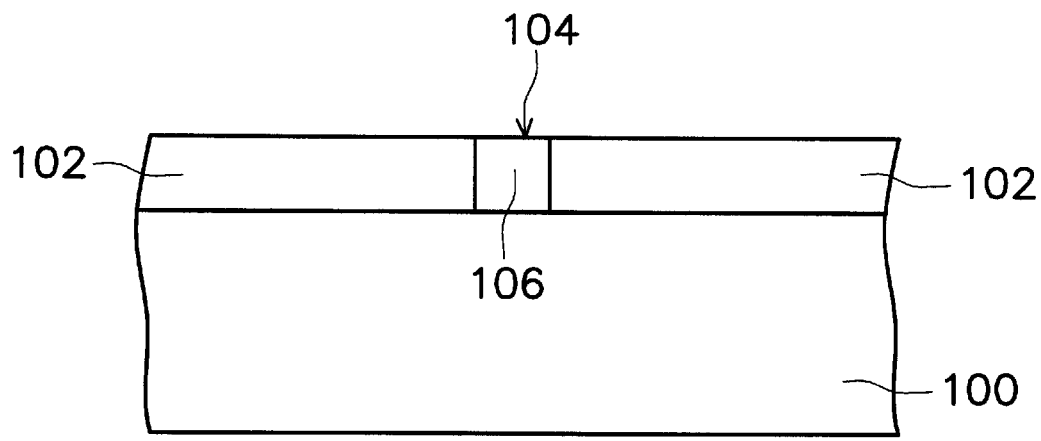
FIGS. 1A to 1G are cross-sectional diagrams showing the process flow of the structure and method of fabricating a MIM stacked capacitor.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1G are cross-sectional diagrams showing the process flow of the structure and method of fabricating a MIM stacked capacitor.

Referring to FIG. 1A, a substrate 100 is covered by a dielectric layer 102. The substrate 100 is formed with a device structure (not shown) while the dielectric layer 102 comprises a $SiO_x$ layer. The method involved in this case is chemical vapor deposition (CVD).

A contact 104 is then defined in the dielectric layer 102 by photolithography and etching to expose a part of the substrate 100, or a device or terminal formed on the substrate 100.

A conducting layer 106 is formed to fill the contact 104. This involves forming firstly a conducting layer (not shown) by CVD to cover the dielectric layer 102 and to fill the contact 104. The conducting layer 106, which covers the surface of the dielectric layer 102, is removed by Reactive Ion Etching (RIE).

The material of the conducting layer 106 in this case comprises a doped polysilicon, which has a doped concentration of about 5E19 phosphorus atoms per $cm^2$.

Figure 1B:
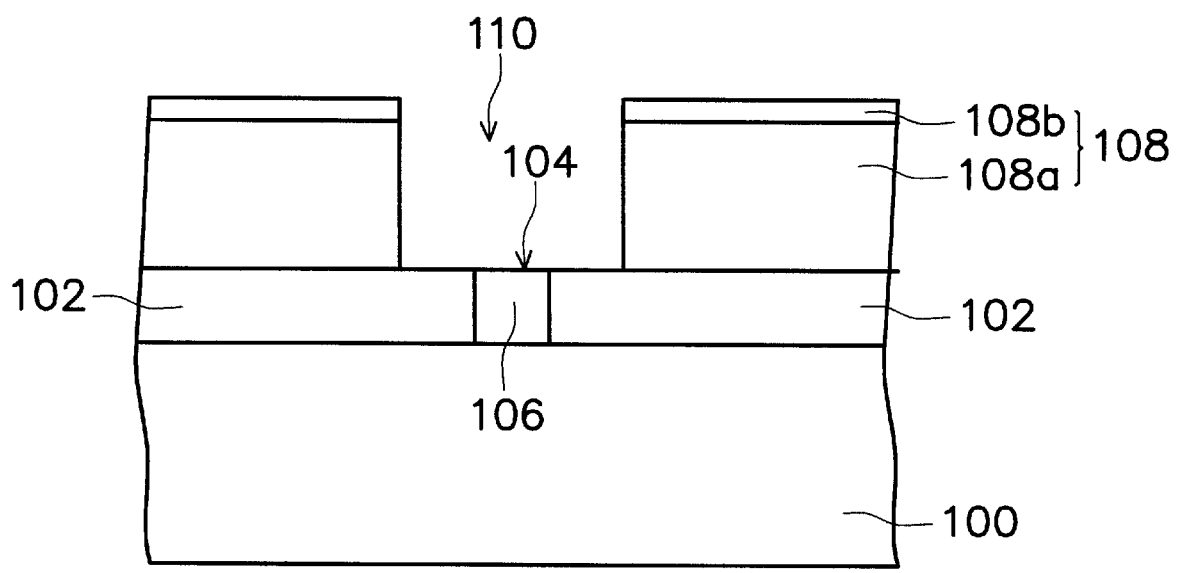

Referring to FIG. 1B, an insulating layer 108 is formed to cover the dielectric layer 102 by CVD.

The material of the insulating layer 108 in this case comprises a stack of borophosphosilicate glass (BPSG) 108a, and silicon nitride ($SiN_x$) 108b. The thickness of BPSG is about 3000–8000 Å, while the thickness of $SiN_x$ is about 200–800 Å.

An opening 110 is then defined in the insulating layer 108 by photolithography and etching to expose the contact 104 which is filled with the conducting layer 106.

Figure 1C:
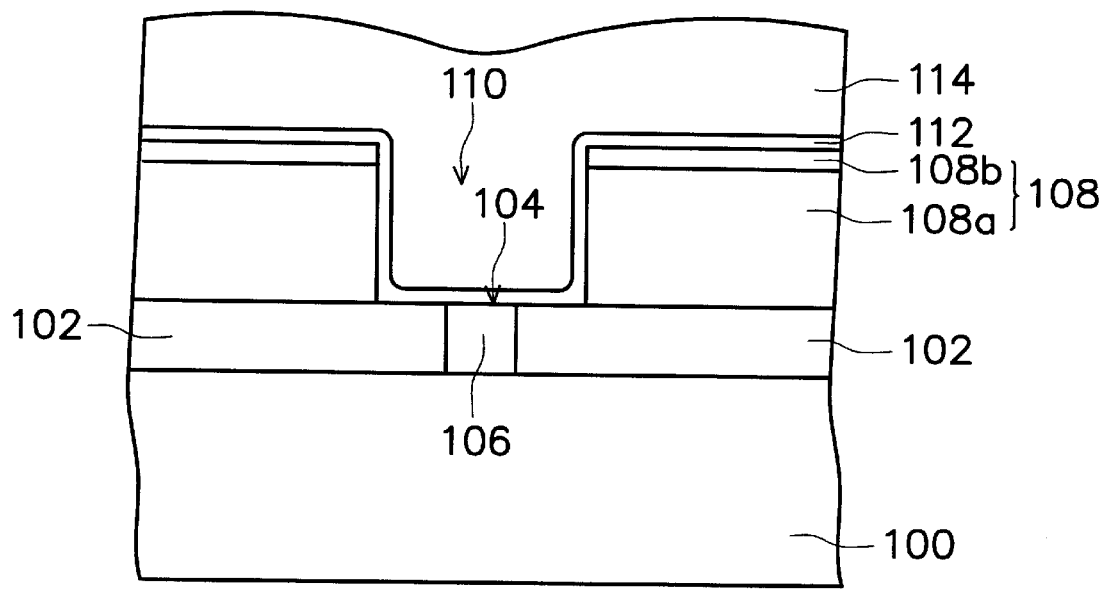

Referring to FIG. 1C, an amorphous silicon layer 112 is conformally formed along a surface profile of the opening region 110 and covers the insulating layer 108. The thickness of the amorphous silicon layer 112 is about 300–1000 Å. The method involved is low pressure chemical vapor deposition (LPCVD) at a temperature of about 510–520° C.

A photoresist layer 114 is formed to cover the amorphous silicon layer 112 and to fill the opening region 110.

Figure 1D:
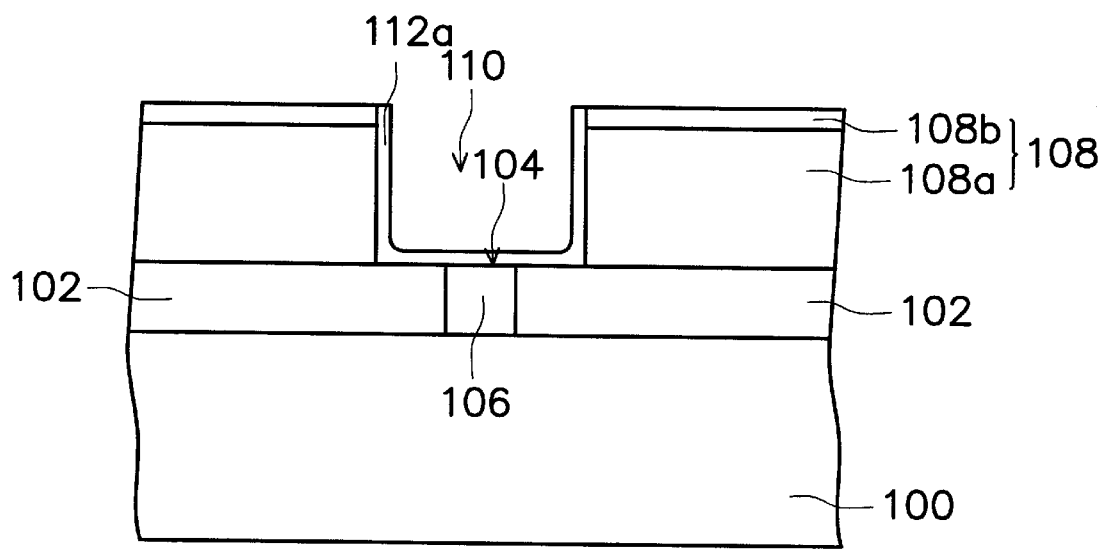

Referring to FIG. 1D, the photoresist layer 114 and the amorphous silicon layer 112 which cover the top surface of the insulating layer 108b are removed with the insulating layer 108b acting as an etch stop. As a result, the remaining photoresist layer 114 and amorphous silicon layer 112 are only present in the opening region 110.

The removing process in this case involves RIE or chemical mechanical polishing (CMP).

The remaining photoresist layer 114 in the opening region 110 is then removed by a wet etching, leaving only a crown shaped amorphous silicon layer 112a.

Figure 1E:
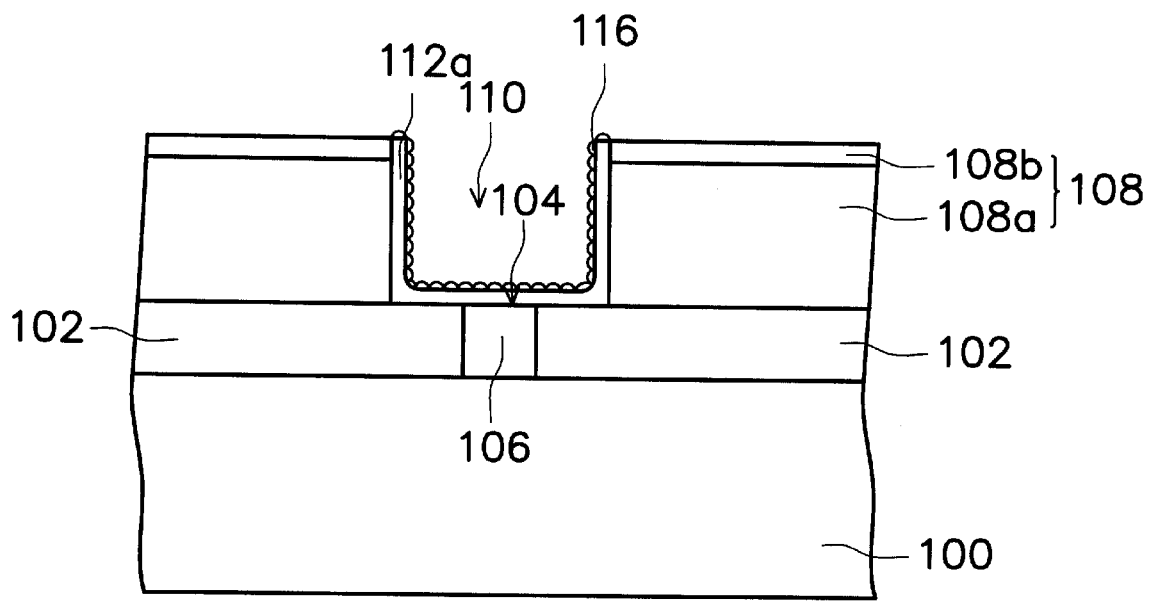

Referring to FIG. 1E, numerous HSG polysilicon 116 are formed on the surface of the amorphous silicon layer 112a in the opening region 110. This method, which involves selectively forming nuclei of the HSG polysilicon 116 on the exposed surface of the amorphous silicon layer 112a with silane ($SiH_4$) or di-silane ($Si_2H_6$) gas in a high vacuum environment of about $10^{-3}$–$10^{-4}$ Torr, is known as the seeding step.

While the structure described above is in an ultra high vacuum atmosphere of about $10^{-8}$–$10^{-9}$ Torr, a heat treatment is performed. This allows the silicon atom in the amorphous silicon layer 112a to migrate to the nuclei of the HSG polysilicon 116 and thus the nuclei grow as the HSG polysilicon 116.

Figure 1F:
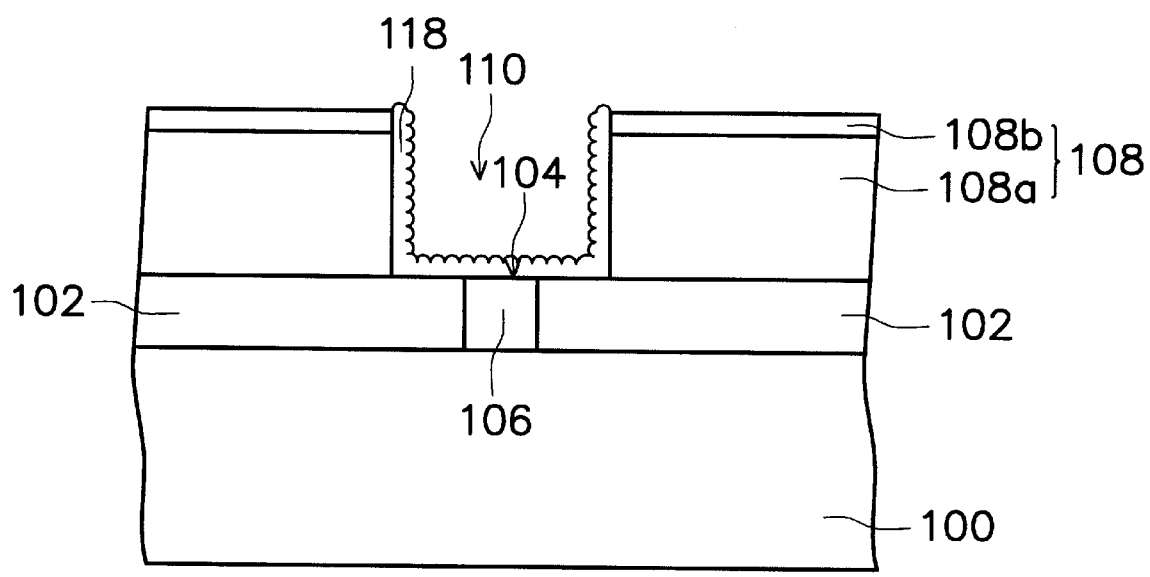

Referring to FIG. 1F, a metal layer 118 is formed. A pre-treatment process is preferably performed before the formation of the metal layer 118 so that the subsequent deposition of the metal layer 118 can be successfully performed. The solution used in the pre-treatment comprises a mixture of $NH_4OH$ and $H_2O_2$.

The metal layer 118 is formed by selective tungsten deposition. This displaces part of or all of the HSG polysilicon 116 and the amorphous silicon layer 112a into tungsten with the following reaction equation:

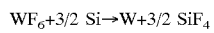

$$WF_6 + 3/2\ Si \rightarrow W + 3/2\ SiF_4$$

As a consequence, the metal layer 118 remains by displacing the HSG polysilicon 116 and the amorphous silicon layer 112a.

Figure 1G:
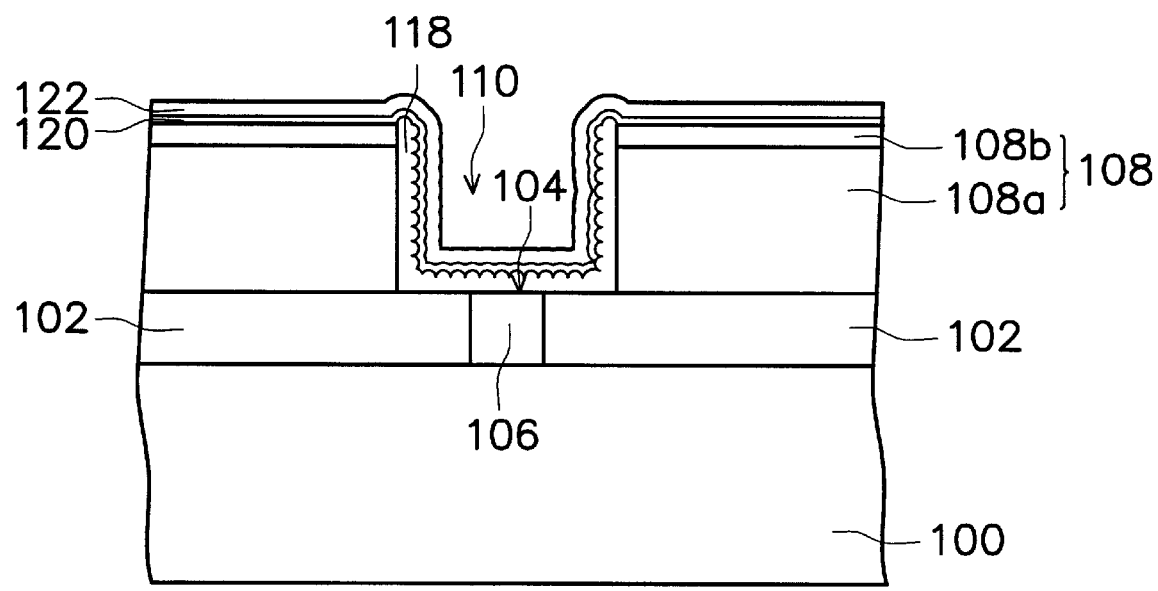

Referring to FIG. 1G, a dielectric layer 120 is formed via CVD to cover the metal layer 118. The material of such dielectric layer includes Tantalum oxide ($Ta_2O_5$).

A metal layer 122 for the upper electrode of the capacitor is formed to cover the dielectric layer 120, so that a capacitor which comprise of the HSG metal layer 118 as the lower electrode, the dielectric layer 120 as the capacitor dielectric, and the metal layer 122 as the upper electrode is formed.

The material of metal layer 122 comprises $TiN_x$ and is formed with a precursor containing $TiCl_4$ in an atmosphere containing $N_2$.

In the subsequent process, the conventional stacked capacitor is fabricated in a process, which is easily achieved by those skilled in the art and therefore will not be described in further detail here.

In the invention, a HSG polysilicon is formed on a crown surface of the amorphous silicon layer. By selective tungsten deposition, the HSG polysilicon and the amorphous silicon layer are displaced with tungsten. A material with a high dielectric constant and a metal layer are formed in sequence as the dielectric layer and the upper electrode of the capacitor, so as to form a MIM capacitor.

The MIM capacitor with a uniform film thickness and rough surface of lower electrode can be obtained by using a well-developed HSG polysilicon formation technology and a selective tungsten deposition technology in the present invention.

The capacitor disclosed in the invention includes a material with a high dielectric constant for the dielectric layer of the capacitor and has an increased surface area of the lower electrode. It is therefore beneficial to the application of a small-sized memory with a high capacitance.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a stacked capacitor, comprising steps of:
   providing a substrate;
   forming a first dielectric layer on the substrate;
   forming a contact in the first dielectric layer;
   forming a doped polysilicon layer to fill the contact;
   forming an insulating layer to cover the first dielectric layer;
   forming an opening in the insulating layer to expose the contact;
   forming a crown shaped amorphous silicon layer to cover the opening;
   forming a plurality of hemispherical grains (HSG) polysilicon on an exposed surface of the crown shaped amorphous silicon layer;
   forming a first metal layer as a lower electrode of the capacitor, the first metal layer is formed from the HSG polysilicon and the crown shaped amorphous silicon layer by a selective metal deposition;
   forming a second dielectric layer to cover the first metal layer; and
   forming a second metal layer to cover the second dielectric layer, wherein the second metal layer as an upper electrode of the capacitor.

2. The fabricating method of claim 1, wherein the insulating layer includes a $SiN_x$ layer.

3. The fabricating method of claim 1, wherein the method of forming the crown shaped amorphous silicon layer, comprising steps of:
   forming an amorphous silicon layer to cover the insulating layer and the opening;
   forming a photoresist to cover the amorphous silicon layer;
   removing the photoresist and the amorphous silicon layer that cover the surface of the insulating layer; and
   removing the photoresist in the opening.

4. The fabricating method of claim 1, wherein the thickness of the crown shaped amorphous silicon layer is about 300–1000 Å.

5. The fabricating method of claim 1, wherein the first metal layer is formed by a selective tungsten deposition.

6. The fabricating method of claim 1, wherein a pre-treatment process is performed before the first metal layer is formed.

7. The fabricating method of claim 6, wherein the solution used in the pre-treatment is a mixture of $NH_4OH$ and $H_2O_2$.

8. The fabricating method of claim 1, wherein the second dielectric layer includes $Ta_2O_5$.

9. The fabricating method of claim 1, wherein the second metal layer is formed by chemical vapor deposition (CVD) using a precursor containing $TiCl_4$.

10. A method of fabricating a stacked capacitor, comprising steps of:
    providing a substrate;
    forming a dielectric layer to cover the substrate;
    forming a contact in the dielectric layer;
    forming a doped polysilicon layer to fill the contact;
    forming an insulating layer to cover the dielectric layer;
    forming an opening in the insulating layer to expose the contact;
    forming a crown shaped amorphous silicon layer to cover the opening;
    forming a plurality of the HSG polysilicon on an exposed surface of the crown shaped amorphous silicon layer;
    forming a tungsten layer as the lower electrode of the stacked capacitor, the tungsten layer is formed from the HSG polysilicon and the crown shaped amorphous silicon layer by a selective tungsten deposition;
    forming a $Ta_2O_5$ layer to cover the tungsten layer; and
    forming a $TiN_x$ layer as the upper electrode of the stacked capacitor to cover the $Ta_2O_5$ layer.

11. The fabricating method of claim 10, wherein the insulating layer includes a $SiN_x$ layer.

12. The fabricating method of claim 10, wherein the method of forming the crown shaped amorphous silicon layer comprises steps of:
    forming an amorphous silicon layer to cover the insulating layer and the opening;
    forming a photoresist to cover the amorphous silicon layer;
    removing the photoresist and the amorphous silicon layer which cover the surface of the insulating layer;
    removing the photoresist in the opening.

13. The fabricating method of claim 10, wherein the thickness of the crown shaped amorphous silicon layer is about 300–1000 Å.

14. The fabricating method of claim 10, wherein a pre-treatment process is preformed before the first metal layer is formed.

15. The fabricating method of claim 14, wherein the solution used in the pre-treatment is a mixture of $NH_4OH$ and $H_2O_2$.

16. The fabricating method of claim 10, wherein the $TiN_x$ layer is formed by CVD using a precursor containing $TiCl_4$.

* * * * *